United States Patent
Stotz (10) Patent No.: US 8,926,465 B2
(45) Date of Patent: Jan. 6, 2015

(54) BIDIRECTIONAL MEMS DRIVING ARRANGEMENT

(71) Applicant: Timex Group USA, Inc., Middlebury, CT (US)

(72) Inventor: Gerhard Stotz, Eisingen (DE)

(73) Assignee: Timex Group USA, Inc., Middlebury, CT (US)

( * ) Notice: Subject to any disclaimer, the term of this patent is extended or adjusted under 35 U.S.C. 154(b) by 120 days.

(21) Appl. No.: 13/735,211

(22) Filed: Jan. 7, 2013

(65) Prior Publication Data

US 2014/0194241 A1    Jul. 10, 2014

(51) Int. Cl.
  *F16H 1/32*   (2006.01)
  *F16H 3/70*   (2006.01)
  *H02N 1/00*   (2006.01)
  *H02K 5/00*   (2006.01)

(52) U.S. Cl.
  CPC ........................................ *F16H 1/32* (2013.01)
  USPC ...................... 475/162; 475/170; 310/40 MM (58) Field of Classification Search
  USPC ............. 475/162, 169, 170, 904; 310/40 MM
  See application file for complete search history.

(56) References Cited

U.S. PATENT DOCUMENTS

| | | | |
|---|---|---|---|
| 3,589,243 A | 6/1971 | Bowman | |
| 5,959,376 A | 9/1999 | Allen | |
| 6,211,599 B1 | 4/2001 | Barnes et al. | |
| 7,592,737 B2 * | 9/2009 | Bourbon et al. | |
| 7,636,277 B2 * | 12/2009 | Minotti et al. | 368/157 |
| 7,738,323 B2 | 6/2010 | Paratte et al. | |
| 8,058,772 B2 * | 11/2011 | Minotti et al. | 310/323.02 |
| 2008/0197749 A1 | 8/2008 | Paratte et al. | |
| 2012/0120262 A1 | 5/2012 | Gutierrez et al. | |

* cited by examiner

*Primary Examiner* — Tisha Lewis
(74) *Attorney, Agent, or Firm* — Carmody Torrance Sandak & Hennessey LLP (57) ABSTRACT

A micro-electromechanical system (MEMS) driving arrangement comprising a driven wheel comprising (n) teeth about an outer periphery thereof, an actuator ring around the driven wheel, itself comprising (n)+(x) teeth about an inner periphery thereof, wherein the (n)+(x) teeth of the actuator ring progressively engage and disengage subsets of the (n) teeth of the driven wheel; a driving actuation assembly, coupled to the actuator ring, for driving the actuator ring in a hysteresis-type motion so as to cause rotation of the driven wheel, wherein after one full cycle of engagements and disengagements between selective subsets of the (n) teeth of the driven wheel with selective subsets of the (n)+(x) teeth of the actuator ring, the driven wheel rotates by (x) teeth corresponding to [(360)(x)/(n)]°.

11 Claims, 6 Drawing Sheets

BIDIRECTIONAL MEMS DRIVING ARRANGEMENT

BACKGROUND OF THE INVENTION

The present invention is directed generally to motor arrangements for driving display hands, rings and other indicators for small (i.e. wearable) electronic devices, and in particular, to a micro-electromechanical systems (MEMS) driving arrangement for an electronic device, and in a particularly desirable embodiment, for driving such hands, rings and/or other indicators in a timepiece, such as a wristworn device. However, it will be understood from the disclosure herein that the invention is not so limiting.

Micro-electromechanical systems (MEMS) that are used as unidirectional and bidirectional drive units are known in the art. For example, one known MEMS drive unit is a bi-directional arrangement that uses at least four individual MEMS actuator portions, which are forming two pairs of individual MEMS actuators that mesh at least at two individual areas with the driven wheel. For each rotating direction, the drive unit requires one pair of MEMS actuator portions, where alternately one of the pairs is driving the wheel while the other one is pulled out of the contact with the wheel. The other pair of actuator portions is needed for rotating the wheel in the opposite driving direction. While driving the wheel in either direction, the actuator portions of the other pair (i.e. for the other direction) must also be pulled out of meshing with the wheel. Each of the four individual actuator portions is an electrostatic activation area, where one area within a pair of MEMS actuators is for generating a tangential driving force or torque to drive the wheel and the other area within the pair is for generating a radial force to pull the drive unit out of meshing with the wheel. An arrangement of the foregoing type thus requires four (4) electrostatic portions.

Another wheel driving actuator design is described in U.S. Pat. No. 7,592,737. In this design, a MEMS device is provided which includes a driven element having a series of teeth. The MEMS device includes a driving element operable to engage the driven element when the driving element is in a meshed position with the series of teeth. A pair of individual driving actuators of the MEMS device moves the driving element with a hysteresis-type motion in and out of meshing with the driven element. Another individual MEMS actuator is moving radially and must be engaged with the wheel to prevent undesired rotation, while the other pair of driving actuators is pulled out of meshing.

It is believed that the existing state of the art has deficiencies, and further believed that advances to the state of the art are both desirable and achievable. For example, in each of the foregoing designs, there are more actuators needed than would be desired. For example, in the first mentioned example above, four actuator portions are needed. In the latter example of the '737 patent, at least three MEMS actuators are needed. In addition, the foregoing arrangements are more complicated than desired for minimizing or preventing undesired motion of the driven wheel.

Accordingly, it is desired to provide a driving arrangement where all of the needed objectives and advantages can be achieved by the use of two MEMS actuators. Moreover, because of the improved design of the driving actuation assembly of the present invention, the preferred embodiments can provide for constant engagement of the driven wheel, thus preventing undesired motion thereof in addition, the present invention's design further leads to a reduced number of needed control signals than heretofore appreciated to achieve all of the needed functionality. Other objectives and features that address deficiencies in the prior art are also provided as disclosed herein.

SUMMARY AND OBJECTIVES OF THE INVENTION

It is thus an objective of the present invention to overcome the perceived deficiencies in the prior art.

Specifically, it is an objective of the present invention to provide an improved driving arrangement for an electronic device that utilizes the advantages afforded by the use of MEMS technology.

Another objective of the present invention is to provide an improved driving arrangement for an electronic device that utilizes the advantages afforded by the use of MEMS technology, but simultaneously reduces the number of actuator portions needed to still provide a bidirectional driving arrangement.

Still another objective of the present invention is to provide improved MEMS driving arrangement that uses an actuator ring and driven wheel combination that preferably does not disengage from at least some meshing so as to prevent slippage or loss of calibration or accuracy of the display indicators controlled by the driving arrangement.

Still another objective of the present invention is to provide an improved MEMS driving arrangement that permits for the construction and use of a smaller and stronger driving assembly than heretofore seen in the art.

Still a further objective of the present invention is to provide methodologies for carrying out and/or facilitating the foregoing.

Further objects and advantages of this invention will become more apparent from a consideration of the drawings and ensuing description.

The invention accordingly comprises the features of construction, combination of elements, arrangement of parts and sequence of steps which will be exemplified in the construction, illustration and description hereinafter set forth, and the scope of the invention will be indicated in the claims.

Therefore, and generally speaking, in accordance with a first preferred embodiment, the invention is directed to a micro-electromechanical systems (MEMS) driving arrangement for an electronic device. In this preferred embodiment, the micro-electromechanical systems (MEMS) driving arrangement comprises a driven wheel having a diameter, comprising (n) teeth about an outer periphery thereof, wherein (n) is a positive integer; an actuator ring having an inner diameter that is greater than the diameter of the driven wheel, comprising (n)+(x) teeth about an inner periphery thereof and wherein (x) is an integer of at least 1; wherein subsets of the (n)+(x) teeth of the actuator ring progressively engage and disengage subsets of the (n) teeth of the driven wheel; a driving actuation assembly, coupled to the actuator ring, for driving the actuator ring in a hysteresis-type motion so as to cause rotation of the driven wheel, the driving actuation assembly comprising: a first driving actuator coupled to the actuator ring for selectively pulling the actuator ring in a first direction and pushing the actuator ring in a direction opposite the first direction thereby causing subsets of the (n)+(x) teeth of the actuator ring to engage and disengage subsets of the (n) teeth of the driven wheel; a second driving actuator coupled to the actuator ring for selectively pulling the actuator ring in a second direction and pushing the actuator ring in a direction opposite the second direction, wherein the first direction is perpendicular to the second direction, thereby causing the (n)+(x) teeth of the actuator ring to engage and disengage subsets of the (n) teeth of the driven wheel; wherein after a full cycle of engagements and disengagements between selective subsets of the (n) teeth of the driven wheel with selective subsets of the (n)+(x) teeth of the actuator ring, the driven wheel rotates [(360)(x)/(n)]°.

In accordance with another preferred embodiment, a method of driving a driven wheel in a micro-electromechanical systems (MEMS) driving arrangement for an electronic device is provided. In such a preferred method, and using the micro-electromechanical systems (MEMS) driving arrangement as set forth above, the method comprises the steps of selectively pulling the actuator ring in a first direction and selectively pushing the actuator ring in a direction opposite the first direction with the first driving actuator thereby causing selected subsets of (n)+(x) teeth of the actuator ring to engage and disengage subsets of the (n) teeth of the driven wheel; selectively pulling the actuator ring in a second direction and selectively pushing the actuator ring in a direction opposite the second direction with the second driving actuator thereby causing selected subsets of (n)+(x) teeth of the actuator ring to engage and disengage subsets of the (n) teeth of the driven wheel; wherein: the first direction is perpendicular to the second direction; and after a fill cycle of engagements and disengagements between selective subsets of the (n) teeth of the driven wheel with selective subsets of the (n)+(x) teeth of the actuator ring, the driven wheel rotates [(360)(x)/(n)]°.

In a preferred embodiment, the wristworn device is a timepiece in the form of a wristwatch.

BRIEF DESCRIPTION OF THE DRAWINGS

The above set forth and other features of the invention are made more apparent in the ensuing Description of the Preferred Embodiments when read in conjunction with the attached Drawings, wherein.

Identical reference numerals in the figures are intended to indicate like parts, although not every feature in every figure may be called out a reference numeral.

DETAILED DESCRIPTION OF PREFERRED EMBODIMENTS

Figure 1A:
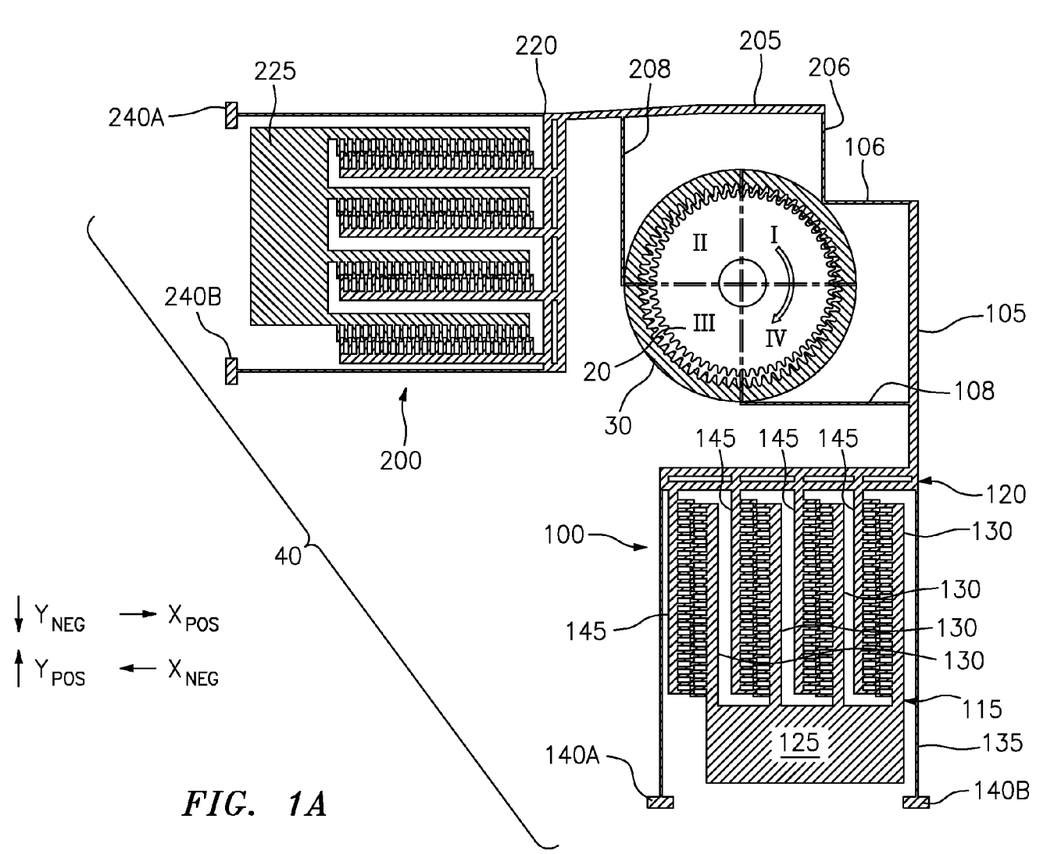
FIGS. 1A and 1B each illustrate a bidirectional MEMS driving arrangement constructed in accordance with preferred embodiments of the present invention.
Figure 1B:
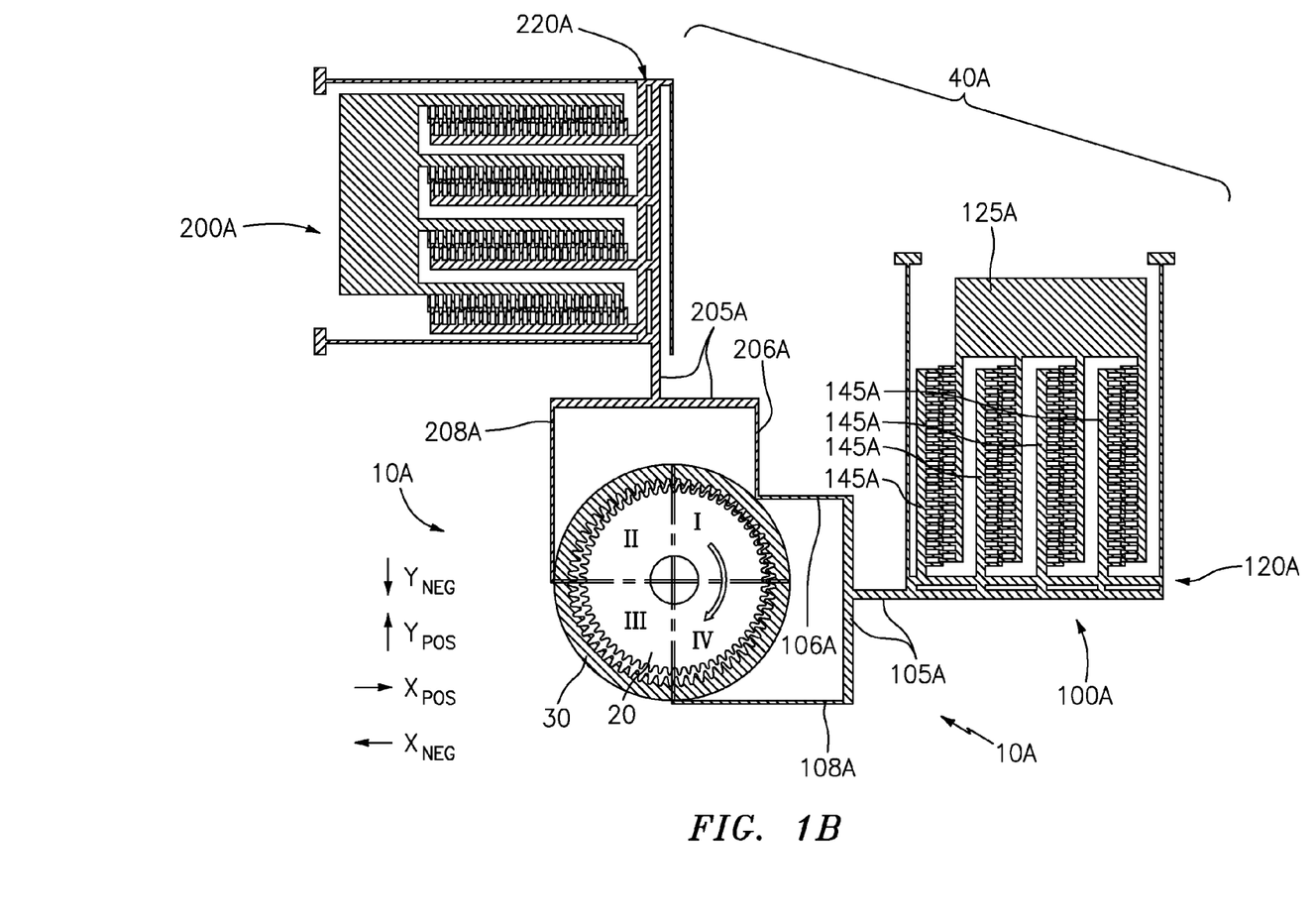

Reference is generally first made to FIGS. 1A and 1B, which illustrate a bidirectional micro-electromechanical systems (MEMS) driving arrangement, generally indicated at 10 and 10A, respectively, constructed in accordance with preferred embodiments of the present invention. Reference herein will generally be made to MEMS driving arrangement 10, but it should be understood that MEMS driving arrangement 10A is constructed and functions identically, except for the difference in the configuration of arms 105, 205 and arms 105A, 205A, as further disclosed below. In a preferred embodiment, MEMS driving arrangement 10 comprises, among other things, a driven wheel 20 having a diameter, comprising (n) teeth about an outer periphery thereof, wherein (n) is an integer preferably in the range of about 300 to about 1000; an actuator ring 30 having an inner diameter that is greater than the diameter of the driven wheel, comprising (n)+(x) teeth about an inner periphery thereof and wherein (x) is an integer of at least 1 and preferably 1, 2, 3 or 4; wherein the (n)+(x) teeth of the actuator ring progressively engage and disengage differing subsets of the (n) teeth of the driven wheel 20 as disclosed herein. To be sure though, (n) can be smaller or larger than the numbers set forth above while still staying within the present invention. Similarly, (x) may be larger than 4 if such design requirements dictate or are desirable.

Driving arrangement 10 also comprises a driving actuation assembly, generally indicated at 40, coupled to the actuator ring 30, for driving the actuator ring 30 in a hysteresis-type motion so as to cause rotation of the driven wheel 20. In a preferred embodiment, the driving actuation assembly 40 comprises a first driving actuator, generally indicated at 100, coupled to the actuator ring 30 for selectively pulling the actuator ring 30 in a first direction and pushing the actuator ring 30 in a direction opposite the first direction; and a second driving actuator, generally indicated at 200, coupled to the actuator ring 30 for selectively pulling the actuator ring 30 in a second direction and pushing the actuator ring 30 in a direction opposite the second direction.

For illustrative purposes only, the "first" direction will be discussed herein as being in the "X" (e.g. horizontal) direction and the "second" direction will be discussed as being in the "Y" (e.g. vertical) direction. However, these are for exemplary, purposes only, as should be understood.

As will be discussed in greater detail below, after one full cycle of engagements and disengagements between selective subsets of the (n) teeth of the driven wheel 20 with selective subsets of the (n)+(x) teeth of the actuator ring 30, the driven wheel 20 will be seen to have rotated by (x) teeth corresponding to [(360)(x)/(n)]°.

More specifically, as the actuator ring 30 is moved through its hysteresis type motion, the teeth of the actuator ring 30 progressively engage and disengage the teeth of the driven wheel 20. This meshing effect imparts a rotation of driven wheel 20.

Preferred dimensions of the driven wheel 20 and actuator ring 30 would be known by those skilled in the art and are thus of routine design choice. Preferably, the shape of the teeth on the driven wheel and actuator ring may be triangular, but they could also be other shapes, such as trapezoidal to possibly reduce the likelihood of interference between the respective teeth as they mesh as disclosed herein. In preferred embodiments of the present invention, the number of teeth for the driven wheel 20 are three hundred (300) and six hundred (600) and the preferred number of teeth for the actuator ring 30 is one more than the number of teeth for the driven wheel 20, thus, being 301 and 601 respectively for the two preferred embodiments mentioned herein (for the avoidance of doubt, the number of teeth of the driven wheel and the actuator ring as depicted in the accompanying figures are less than the preferred numbers of 300, 600 for the driven wheel 20, but this has been done for illustrative purposes only).

That is, because of the very fine structure of the combs of MEMS actuators and the correspondingly limited possible travel (stroke) the movable part of such fine structured combs can perform, the size and pitch of the respective teeth must correspondingly be also very fine. Therefore, while the illustrated figures are on the order of 60 teeth (for driven wheel 20) and 61 (for the actuator ring 30), in reality the numbers of teeth are significantly higher. Moreover, as would be understood by those skilled in the art, the selected number of teeth for the driven wheel 20 and the actuator ring 30 will lead to a certain size of the wheel and therefore of the whole MEMS unit.

Moreover, while the preferred number of teeth (n) of the driven wheel 20 is about 300 to about 1000, and in particularly preferred examples, 300 and 600, the number of teeth of the actuator ring will be higher as explained herein by a number (x), which preferably is (1) for the reasons explained below, but could also be e.g. (2) or (3) or (4).

That is, for a relatively small-sized driven wheel 20, a preferred embodiment uses 300 teeth for the driven wheel 20 and 301 teeth for the actuator ring 30. For a slightly larger design, the driven wheel 20 may have 600 teeth and therefore there would be 601 teeth for the actuator ring 30.

The reason the preferred difference i.e. (x) in the number of teeth between the driven wheel 20 and the actuator ring 30 is only one (1) is because it can thus be ensured that the diameters of the driven wheel 20 and the actuator ring 30 are small and close enough to ensure that there is no way for disengagement between the driven wheel 20 and the actuator ring 30. However, with a difference (x) that is larger than one (1) between the numbers of teeth of the driven wheel 20 and of the actuator ring 30, the risk increases that the actuator ring 30 could elastically move into a middle position, so that the driven wheel 20 ends up positioned somewhere in the center of the actuator ring 30, where there would be lacking any engagement between the driven wheel 20 and the actuator ring 30.

The particulars of the driving actuators 100, 200 will now be discussed in greater detail in connection with the movement of the actuator ring 30, with the "x-direction" driving actuator being identified with driving actuator 100 and the "y-direction" driving actuator being identified with driving actuator 200. However, reference will be more specifically made to x-direction driving actuator 100, with y-direction driving actuator 200 being constructed and operating the same as x-direction driving actuator 100. For further details of such driving actuators, reference may be had to U.S. Pat. No. 7,592,737, the subject matter of which is incorporated by reference as if fully set forth herein.

In the preferred embodiment of FIG. 1A, "x-direction" driving actuator 100 comprises, among other things, a driving element in the form of an arm 105, extending outwardly from a mobile part 120, which will be further disclosed below. As illustrated in FIG. 1A, arm 105 can be seen as linear (i.e.|) or "L" shaped, depending only on one's subjective frame of reference. In the preferred embodiment of FIG. 1B, "x-direction" driving actuator 100A comprises, among other things, a driving element in the form of an arm 105A also extending outwardly from a mobile part 120A, which is identical to mobile part 120. As illustrated in FIG. 1B, arm 105A can be seen as "T" shaped, but in all other respects, driving actuation assembly 40 and driving actuation assembly 40A are identical. Arm 105, 105A is preferably stiff and inelastic and part of the MEMS structure. Respectively connected to arm 105, 105A are two additional arms 106, 106A and 108, 108A. Arms 106, 106A on the one hand, and arms 108, 108A on the other hand, depending on the design or shape of arm 105, 105A, can either have the same length or can have two different lengths as illustrated, and their respective distal ends are connected to actuator ring 30 as all being of a unitary MEMS structure at the positions illustrated in respective FIGS. 1A and 1B. To be sure however, arm 106 is intended to have the same length as arm 106A and arm 108 is intended to have the same length as arm 108A. The distal ends of arms 106, 106A are connected to actuator ring 30 in quadrant I, and in particular, at an essentially 45° angle with respect to a horizontal axis through actuator ring 30. The distal ends of arms 108, 108A are preferably connected as being part of a unitary MEMS structure to actuator ring 30 at a position that can be deemed along the Y-axis, essentially 135° clockwise measured from the first connection point of respective arms 106, 106A. Respective FIGS. 1A, 1B illustrate the positions thereof.

A similar arrangement exists with respect to "y-direction" driving actuator 200. For example, in the preferred embodiment of FIG. 1A, "y-direction" driving actuator 200 comprises, among other things, a driving element in the form of an arm 205, extending outwardly from a mobile part 220, which functions identically to mobile part 120. As illustrated in FIG. 1A, arm 205 can also be seen as linear (i.e. |) or "L" shaped. The "y-direction" driving actuator 200A in FIG. 1B also includes a driving element in the form of an arm 205A also extending outwardly from a mobile part 220A, which is identical to mobile part 220. In FIG. 1B, arm 205A can be seen as "T" shaped. Here too, arm 205, 205A is preferably stiff and inelastic, as with arm, 105, 105A. Respectively connected to arm 205, 205A are similarly two additional arms 206, 206A and 208, 208A. Arms 206, 206A are preferably the same length as arms 106, 106A and arms 208, 208A are also preferably of the same length as arms 108, 108A. Likewise, the respective distal ends of arms 206, 206A and 208, 208A are in the same manner connected to actuator ring 30 as being part of a unitary MEMS structure, as illustrated in the respective figures. For example, the distal end of arm 206, 206A is also connected to actuator ring 30 in quadrant I at an essentially 45° angle with respect to a horizontal axis through actuator ring 30. The distal ends of arm 208, 208A is preferably connected by the same means to actuator ring 30 at a position that can be deemed on the X-axis, essentially 135° counterclockwise measured from the first connection point of respective arms 206, 206A. Respective FIGS. 1A, 1B illustrate the positions thereof.

As can be seen, arms 106, 106A and arms 108, 108A are in parallel to the direction of movement of mobile part 120, 120A, respectively, and arms 206, 206A and arms 208, 208A are in parallel to the direction of movement of mobile part 220, 220A, respectively.

The reason for the preferred use of at least two thin long arms 106, 106A and 108, 108A for the x-direction driving actuators and at least two thin long arms 206, 206A and 208, 208A for the y-direction driving actuators is to allow only a parallel displacement of the actuator ring 30 in the respective "x" and "y" directions without remarkable rotation. The two thin long respective arms associated with each driving actuator 100, 200 and 100A, 200A are functioning similar to two parallelogram suspensions, where one driving actuator 100, 100A can control the displacement of the actuator ring 30 position only in the x-direction and the other driving actuator 200, 200A can control the displacement of the actuator ring 30 position only in the y-direction. If the length of the two thin long arms is not the same, as shown in FIGS. 1A, 1B, there will be sufficiently parallel displacements with negligible rotary motion of the actuator ring.

It should be understood that more than two thin long arms to each of the driving actuators are not necessary, but are possible as long as they are flexible enough to be bent in the sideways direction.

As will be understood shortly, arm 106, 106A and 108, 108A cause actuator ring 30 to move in the "X" direction, and specifically, both to the right (e.g. as illustrated by arrow "$X_{pos}$" in FIGS. 1A, 1B) and to the left (e.g. as illustrated by arrow "$X_{neg}$" in FIGS. 1A, 1B).

Likewise arms 206, 206A and 208, 208A cause actuator ring 30 to move in the "Y" direction, and specifically, both upwardly (e.g. as illustrated by arrow "$Y_{pos}$" in FIGS. 1A, 1B) and downwardly (e.g. as illustrated by arrow "$Y_{neg}$" in FIGS. 1A, 1B).

"X-direction" driving actuator 100 and "y-direction" driving actuator 200 are preferably electrostatic modules with a comb structure as will now be discussed with particular reference to "x-direction" driving actuator 100, as "y-direction" driving actuator functions in an identical manner. While further details of "x-direction" driving actuator will now be provided, all references throughout this application to driving actuator 100 also equally apply to actuator 100A and all references throughout this application to driving actuator 200 also equally apply to actuator 200A.

"X-direction" driving actuator 100 is formed from a "fixed" part 115 and a "mobile" part 120, the latter to which arm 105 is connected. It should be understood that by "fixed" it is meant to refer to an element, part or member that is embedded in the substrate, while the term "mobile" is intended to refer to an element, part or member that is positioned a few microns above the substrate by elastic suspensions (noted below) which are also embedded in the substrate.

Fixed part 115 includes a radial electrode 125 from which a fixed set of parallel combs 130 outwardly extend. Each comb 130 is formed from a main rod and a series of parallel fingers connected to the rod and extending perpendicularly thereto.

The mobile part 120 includes a frame 135 that has a general U shape and that extends around the fixed part 115. The frame 135 is connected at each of its ends to the substrate, by means of embedding links 140A, 140B comprising the elastic suspensions. Combs 145 extend from the frame 135 in a general outwardly direction, and are similarly formed from a main rod and a series of parallel fingers connected to the rod and extending perpendicularly thereto.

Combs 130 of fixed part 115 and combs 145 of mobile part 120 are positioned parallel to each other and interleaved with each other, such that each comb 145 is located facing a fixed comb 130 so that their fingers interleave with each other.

"Y-direction" driving actuator 200 has a structure similar to that of "x-direction" driving actuator 100, except that "y-direction" driving actuator 200 is oriented perpendicularly to "x-direction" driving actuator 100.

In operation, the interleaved fingers of the combs are similar to flat capacitors, one of whose plates is connected to the electrode 125 of "x-direction" driving actuator 100 or the corresponding electrode 225 of "y-direction" driving actuator 200, with the other plate being connected to ground via the respective embedding links 140A, 140B of "x-direction" driving actuator 100 and 240A, 240B of "y-direction" driving actuator 200.

As to "x-direction" driving actuator 100, when a voltage is applied to the radial electrode 125, this voltage creates a potential difference between the fixed part 115 and the mobile part 120. An electric field is established between the plates of the capacitors formed by the fingers of the combs 130 and 145. This electric field generates an electrostatic force which moves combs 145 in relation to the fixed combs 130 in a direction parallel to the fingers of the combs, thereby moving arm 105 in a corresponding direction. That is, the electrostatic force acting between the fingers of the combs leads to the movement of the frame 135 and, as a consequence, to linear motion of arm 105 in a direction $X_{pos}$ in relation to the actuator ring 30.

A similar operation occurs with respect to "y-direction" driving actuator 200, in that when a voltage is applied to electrode 225, the electrostatic force created results in the linear motion of arm 205 in the $Y_{pos}$ direction relative to the actuator ring 30.

Said another way, if there is no voltage difference applied between the electrode 125 with its combs 130 and the combs 145 connected to the mobile part 120, or between the electrode 225 with its associated/connected combs and the combs associated/connected to the mobile part 220, there will be no electrostatic force generated, and the actuator ring 30 will be held in its rest position by the elastic forces between the respective combs. This initial position is shown as the start position in FIG. 1A, 1B and in FIG. 5 as the end position after one complete actuation cycle. On the other hand, if a voltage difference is applied between the electrode 125 with its combs 130 and the combs 145 connected to the mobile part 120, and/or between the electrode 225 with its connected combs and the combs connected to mobile part 220, (an) electrostatic attraction force(s) will be generated in the corresponding x-direction and/or y-direction driving actuators, and the actuator ring 30 will be pulled in the corresponding x-direction and/or y-direction.

Further details of actuators 100, 200 that are not material to the present invention may be found in the aforementioned U.S. Pat. No. 7,592,737.

Reference is next made to FIGS. 2-5, which illustrate the consecutive phases of the motion of the actuator ring 30 and of the rotation of the driven wheel 20.

For purposes of illustration, FIG. 1A can be viewed as an exemplary initial position of actuator ring 30, where neither "x-direction" driving actuator 100 nor "y-direction" driving actuator 200 are shown to be actuated. Therefore, and due to their respective spring characteristics, arm 105 of "x-direction" driving actuator 100 can be seen to be "pushing" actuator ring 30 in the $X_{neg}$ direction and "y-direction" driving actuator 200 can be seen to be "pushing" actuator ring 30 in the $Y_{neg}$ direction. The actions of both "x-direction" driving actuator 100 and "y-direction" driving actuator 200 in this manner causes actuator ring 30 to be pushed against driven wheel 20 in essentially the 45° area within quadrant I (see FIGS. 1A, 1B). It is thus in this 45° area in quadrant I where there will exist the deepest meshing of the actuator ring 30 and the driven wheel 20 in this condition of "x-direction" driving actuator 100 and "y-direction" driving actuator 200. In this condition, it can be seen in FIG. 1A that the tooth of driven wheel 20 indicated as "1" is engaged and to the left of the tooth of actuator ring 30 that is indicated as "A."

Figure 2:
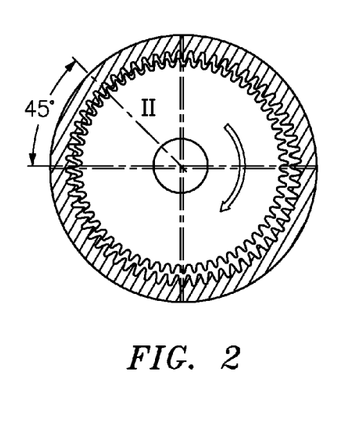
FIGS. 2, 3, 4 and 5 illustrated the successive movements of an actuator ring and a driven wheel upon actuation by the driving actuation assemblies of FIGS. 1A and/or 1B, all constructed in accordance with preferred embodiments of the present invention.

Next, and as illustrated in FIG. 2, upon actuation of "x-direction" driving actuator 100 as set forth above, arm 105 causes a "pulling" of actuator ring 30 in the $X_{pos}$ direction. "y-direction" driving actuator is still (and intentionally) not actuated, and due to its spring characteristics, "y-direction" driving actuator 200 continues to cause arm 205 to "push" actuator ring 30 in the $Y^{neg}$ direction. As a result, actuator ring 30 will be pushed against the driven wheel 20 in the 45° area within quadrant II. It is thus in this 45° area in quadrant II where there will exist the deepest meshing of the actuator ring 30 and the driven wheel 20 in this condition of "x-direction" driving actuator 100 and "y-direction" driving actuator 200. Here, it can also be seen that the tooth of driven wheel 20 indicated as "1" is still engaged and to the left of the tooth of actuator ring 30 that is indicated as "A," although tooth "A" has shifted slightly away from the right side of tooth "1."

Figure 3:
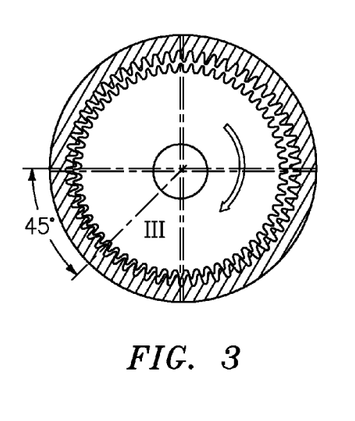

Reference is next made to FIG. 3, which illustrates the condition wherein "x-direction" driving actuator 100 is still in its actuated state and thus arm 105 is "pulling" actuator ring 30 in the $X_{pos}$ direction. Moreover, "y-direction" driving actuator 200 is also now in its actuated state and is likewise "pulling" actuator ring 30 in the $Y_{pos}$ direction. The actions of both "x-direction" driving actuator 100 and "y-direction" driving actuator 200 in this manner causes actuator ring 30 to be pushed against driven wheel 20 in essentially the 45° area within quadrant III (see FIG. 1). It is thus in this 45° area in quadrant III where there will exist the deepest meshing of the actuator ring 30 and the driven wheel 20 in this condition of "x-direction" driving actuator 100 and "y-direction" driving actuator 200. Here, it can also be seen that the tooth of driven wheel 20 indicated as "1" is starting to disengage from actuator ring 30 and is only slightly to the left of the tooth "A" of the actuator ring 30.

Figure 4:
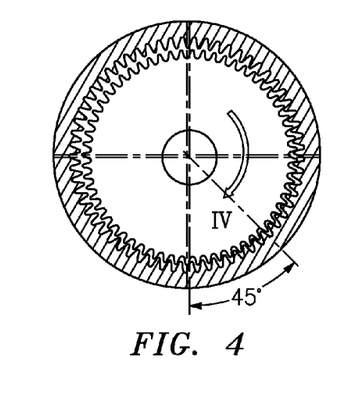

Reference is next made to FIG. 4, which illustrates the condition wherein "x-direction" driving actuator 100 is now again in its non-actuated state and thus arm 105 is "pushing" actuator ring 30 in the $X_{neg}$ direction, while "y-direction" driving actuator 200 is still in its actuated state and "pulling" actuator ring 30 in the $Y_{pos}$ direction. The actions of both "x-direction" driving actuator 100 and "y-direction" driving actuator 200 in this manner causes actuator ring 30 to be pushed against driven wheel 20 in essentially the 45° area within quadrant IV. It is thus in this 45° area in quadrant IV where there will exist the deepest meshing of the actuator ring 30 and the driven wheel 20 in this condition of "x-direction" driving actuator 100 and "y-direction" driving actuator 200. In this condition, it can be also be seen that the tooth of driven wheel 20 indicated as "1" is starting to engage again with the actuator ring 30, but it has now passed tooth "A" of the actuator ring 30 to the right thereof.

Figure 5:
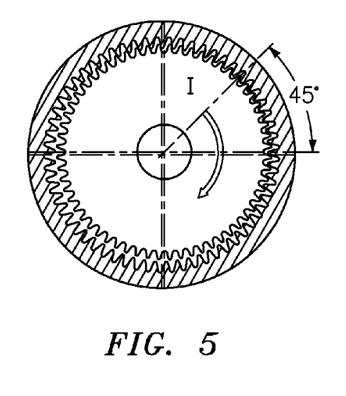

And finally, reference is made to FIG. 5, which illustrates the condition wherein both "x-direction" driving actuator 100 and "y-direction" driving actuator are in their respective non-actuated states, and thus both arms 105, 205 are once again each "pushing" actuator ring 30 in the $X_{neg}$ direction and $Y_{neg}$ directions, respectively, due to their respective spring characteristics. The actions of both "x-direction" driving actuator 100 and "y-direction" driving actuator 200 in this manner causes actuator ring 30 to once again be pushed against driven wheel 20 in essentially the 45° area within quadrant I. It is thus in this 45° area in quadrant I where there will exist the deepest meshing of the actuator ring 30 and the driven wheel 20 in these non-actuated conditions of "x-direction" driving actuator 100 and "y-direction" driving actuator 200. In this condition, it can be also be seen that the tooth of driven wheel 20 indicated as "1" has now passed tooth "A" of actuator ring 30, and is now located right of tooth "A" of the actuator ring 30.

As can thus be seen from the foregoing, actuator ring 30 has moved (not rotated) in a hysteresis like motion first in the $X_{pos}$ direction, then in the $Y_{pos}$ direction, then in the $X_{neg}$ direction and finally in the $Y_{neg}$ direction, with the result being that during this one complete motion cycle the external teeth of the driven wheel 20 have been rolled through the complete number of internal teeth of the actuator ring 30, but because the number of teeth of the actuator ring 30 is greater than the number of teeth of the driven wheel 20, the driven wheel 20 has been rotated exactly by the number corresponding to the difference in the number of teeth between actuator ring 30 and driven wheel 20. For example, in the illustrated embodiment, the difference in the number of teeth between actuator ring 30 and driven wheel 20 is one (1). Therefore (and it can be seen that), the foregoing sequence of steps results in the driven wheel being rotated by 1 tooth.

As set forth above, the driven wheel 20 can thus be seen to have rotated by (x) teeth corresponding to $[(360)(x)/(n)]°$, or in a first preferred embodiment, by one tooth. Using the preferred examples set forth above, with (n) being equal to 300 and (x) being equal to 1 (i.e. the driven wheel has 300 teeth and the actuator ring has 301 teeth), then it can be seen that a fill driving cycle of the actuator ring will lead to a rotation angle of the driven wheel of 1.2°. However, with the same number of teeth on driven wheel 20, an increased differential in the number of teeth on actuator ring 30 will result in a further rotation of the driven wheel 20 for an entire sequence of movement of the actuator ring 30. For example, if the differential in the number of teeth is two (2) and the number of teeth on driven wheel 20 remains at 300, then the driven wheel will rotate 2.4° in one full cycle of engagements and disengagements (i.e. from FIG. 1 to FIG. 5). Further changes to (n) and/or (x) will lead to different rotational amounts for a given full cycle of engagements and disengagements as would now be understood by those skilled in the art.

Figure 6:
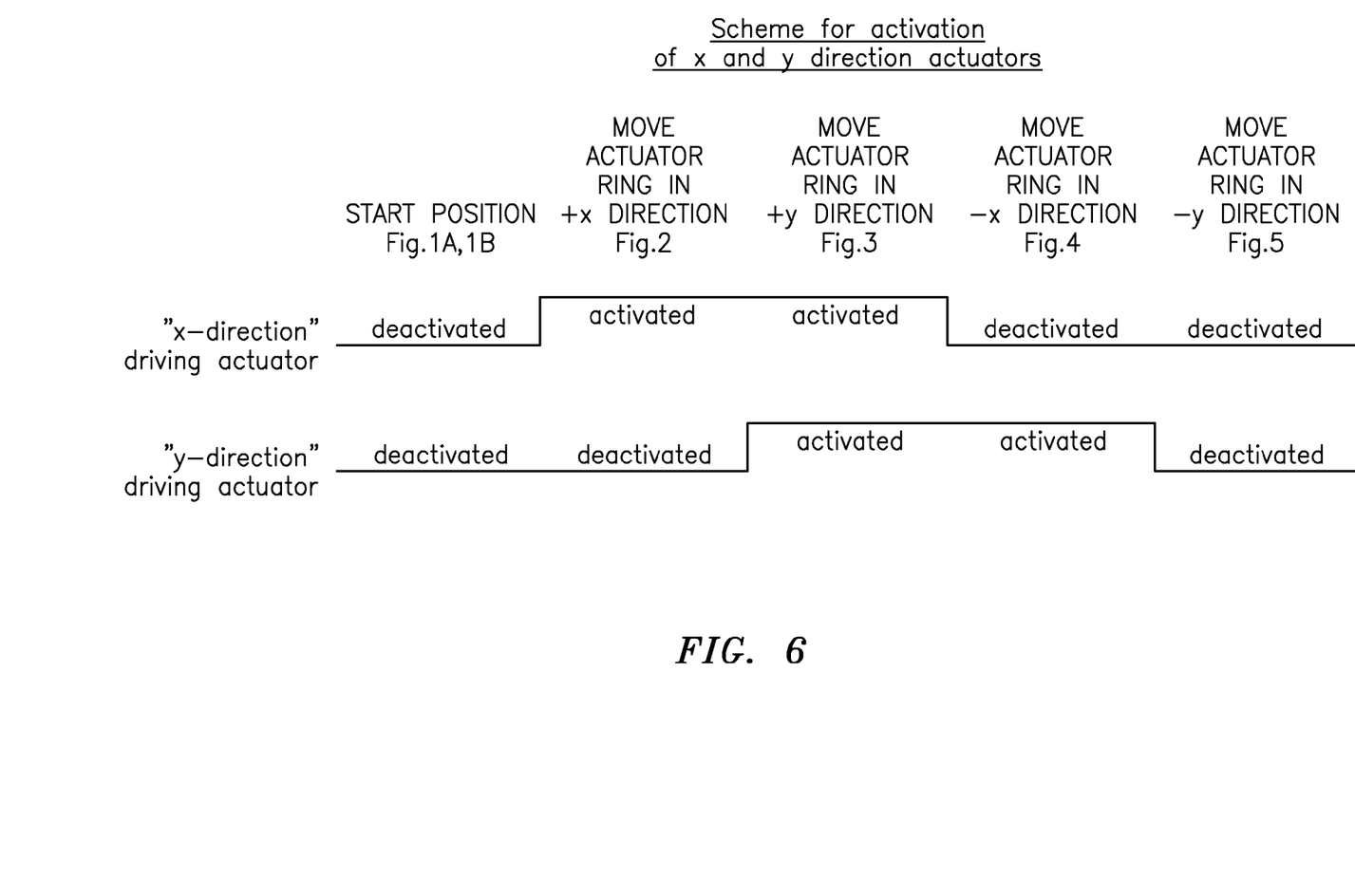
FIG. 6 illustrates a preferred scheme for actuation of an exemplary x-direction driving actuator and a y-direction driving actuator.

FIG. 6 illustrates an exemplary signaling scheme for actuation and de-actuation of "x-direction" driving actuator 100 and "y-direction" driving actuator 200 for carrying out the foregoing sequence about FIGS. 1-5.

Moreover, as would be understood by those skilled in the art, the frequency of the signals would preferably be dependent on the shape and size of the driven wheel 20, and of those further gears and, for example, display hands, that is/are driven by driven wheel 20. Other signaling and control features and particulars would be understood by those skilled in the art.

As should also now be appreciated, the present invention is well suited for applications, such as for the motor(s) of a timepiece for example. For example, the present invention enables a conventional driving gear train to be simplified by replacing the stepping motors with a driven wheel. Alternatively, and even in further simplification, the traditional wheel trains can be replaced with driven wheel 20, which could be coupled to the display hand to be driven. This direct coupling of the driven wheel to the display indicator could further simplify the construction and results in the elimination or reductions of the gears previously deemed necessary. In either of these embodiments, an ordinary skilled designer would know how to adjust and determine appropriate torque constraints, gear reductions, and the like.

Figure 7:
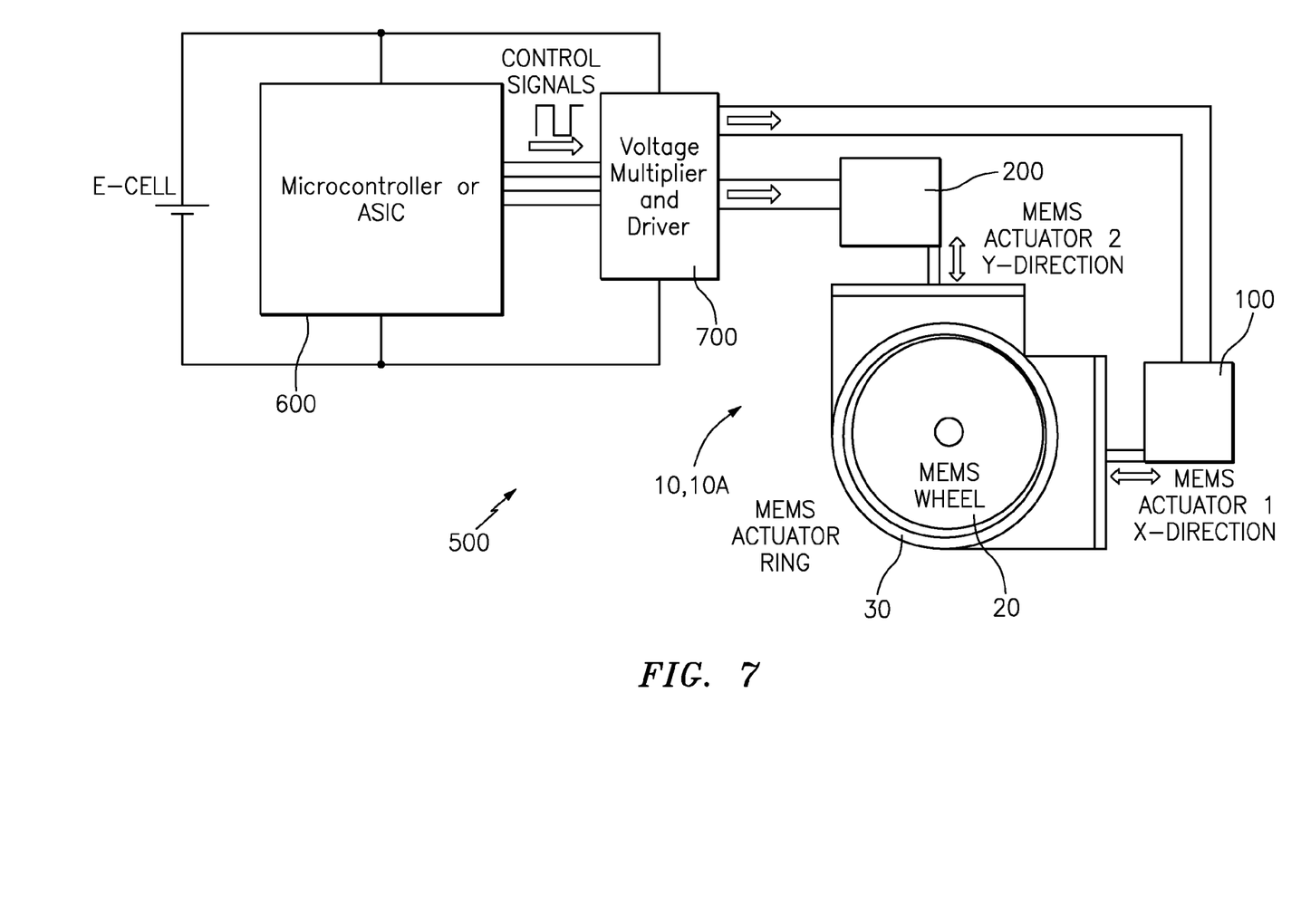
FIG. 7 illustrates a block diagram of an exemplary configuration for controlling MEMS driving arrangements of the preferred embodiments of the present invention.
Figure 8:
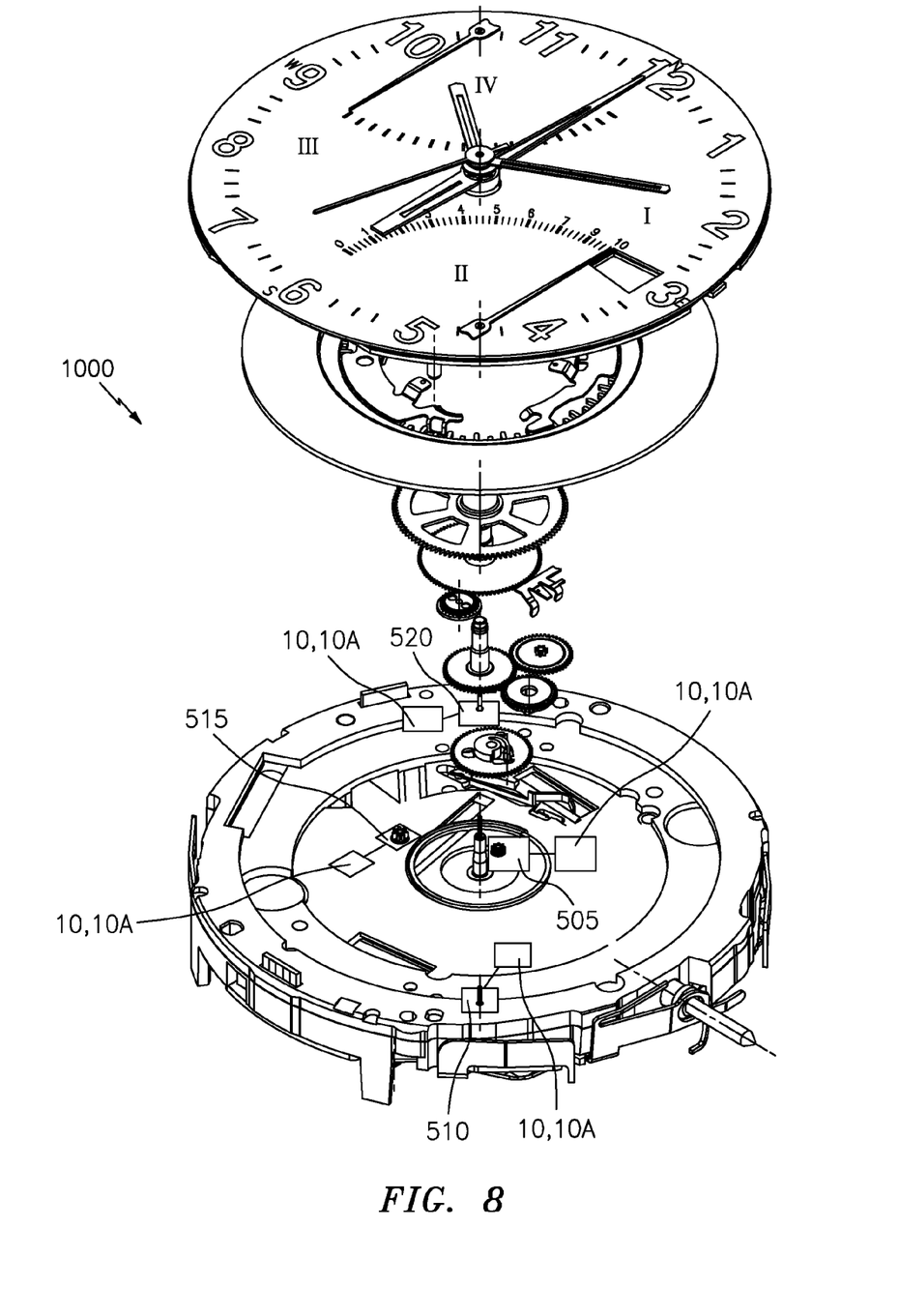
FIG. 8 is an exemplary configuration of an electronic device, and a timepiece by example, that incorporates preferred embodiments of the present invention.

For example, reference is also made to FIGS. 7 and 8 which illustrate, respectively, a block diagram of a MEMS driving unit incorporating the preferred embodiments of the present invention and an exemplary timepiece that includes the constructions set out above, including, but not limited to, the preferred embodiments of the present invention and the functionality set forth in FIG. 7.

As illustrated in FIGS. 7 and 8, the preferred embodiments of the present invention are preferably incorporated into a timepiece, but those skilled in the art will appreciate that the uses and advantages thereof may be more varied and widespread. To this end, the subject matter of U.S. Pat. No. 7,113,450, which discloses just a few of the uses of the present invention in electronic devices other than traditional wristwatches, is incorporated herein by reference as if fully set forth herein. However, being that the preferred embodiment is a timepiece and a wristwatch in particular, it will thus be understood that such a timepiece will comprise other features and parts not material to the present invention.

In view thereof, and other well known concepts by those skilled in the art, coupling one or more driven wheels 20 as disclosed herein to one or more gears and/or gear trains and/or the display indicator itself to rotate, pivot and/or otherwise move one or more display indicators, such as display hands (e.g. hour, minute and/or second hands) and/or rings and/or even linear display hands, will be omitted as being well within the purview of one skilled in the art. To be sure, the disclosure of the aforementioned '450 patent can be consulted therefore. For example, as alluded to above, an exemplary driven wheel 20 can be used to replace a traditional rotor of a stepper motor and/or the conventional gear train itself and the number of such driven wheels 20 in any electronic device will vary based on a number of factors, including but not limited to the number of display indicators to be used. For example, if the driven wheel 20 and the associated display indicator are coupled together by a corresponding gear or gear train, exemplary constructions being set forth in many of the present Assignee's patents, including but not limited to the aforementioned '450 patent.

As such, FIG. 7 provides an exemplary block diagram of a larger arrangement, generally indicated at 500, that utilizes one of the MEMS driving arrangements 10, 10A disclosed herein. For example, arrangement 500 comprises a controller, generally indicated at 600, a voltage multiplexer and driver, generally indicated at 700, and a MEMS driving arrangement (either arrangement 10 or 10A is suitable, although FIG. 7 represents arrangement 10A, but this is by way of example only and not limitation).

As disclosed above, driven wheel 20 is preferably able to rotate in either direction and in small increments, as would be understood in the art. It should also be understood that it is well within the skill of the designer to design an appropriate gearing ratio to provide for the desirable display rotation or movement of all the display indicators to be used. For example, it may be desirable for the incremental rotation of the hands to be quite small (e.g. for a compass), thus providing for precise increments and display measurements. At the least, the typical rate of rotation (with and/or without gears) will be configured to appropriately rotate, pivot and/or move a display indicator, such as an hour, minute and/or second hand or the like.

Controller 600 is preferably an integrated microcontroller or ASIC typically used with electronic watches, and provides control signals as disclosed in FIG. 6 to voltage multiplexer and driver 700 as would be understood in the art. In turn, multiplexer/driver 700 is coupled to, and outputs pulsed and other needed signals necessary to move each of the driving arrangements 10 and/or 10A included in the timepiece. That is, while FIG. 7 shows the inclusion of only one driving arrangement 10 or 10A, it should be understood that this is by example only and not limitation. That is, in view of the foregoing, a plurality of MEMS driving arrangements can be coupled to controller 600 and multiplexer/driver 700 in a known manner, all of which is up to and known by a skilled artisan and designer. In this way, the "x-direction" driving actuator(s) 100 and "y-direction" driving actuator(s) 200 can be driven in the directions as set forth above, thus causing the rotation of each driven wheel 20 as disclosed herein and incorporated into the electronic device. If needed, those non-essential details regarding the functionality and construction of controller 600 can be had by referring to the controller in the aforementioned '450 patent. Again, all details of, for example, display control, circuit design, controller functionality and examples of constructions of embodiments that use the present invention can be found in the '450 patent, which is incorporated by reference as if fully set forth herein. In a preferred embodiment, a conventional battery or hydrogen based enclosed fuel cell ("E-cell") may be used for powering arrangement 500.

FIG. 8 illustrates an exemplary timepiece, generally indicated at 1000, which incorporates a plurality of MEMS driving arrangements, generically indicated at 10, 10A and intended to refer to arrangement 10 or 10A. A single (or multiple) controller 600 and multiplexer/driver 700 configuration can be utilized as would be understood in the art to operate the respective driving arrangements 10 and/or 10A. FIG. 8 illustrates four (4) MEMS driving arrangements 10 or 10A, each with an exemplary associated gear train 505, 510, 515 and 520, which in turn is coupled to one or more of the driving indicators as would be understood in the art. However, as indicated above, the preferred embodiment could omit the gear trains if desired and have the associated driven wheel 20 coupled directly to the display indicator if desired.

In addition, the foregoing arrangement has the added advantage of being able to operate in the reverse direction (i.e. rotating the driven wheel 20 in the counterclockwise direction (as opposed to the clockwise direction as illustrated in the sequence of FIGS. 1-5). This would easily be accomplished by reversing the order of the actuations and de-actuations of "x-direction" driving actuator 100 and "y-direction" driving actuator 200, as should now be understood from the disclosure.

It can thus be seen that the present invention provides an improved driving arrangement for an electronic device that utilizes the advantages afforded by the use of MEMS technology. For example, the present invention allows for the reduction of the number of actuator portions needed to still provide a bidirectional driving arrangement using such MEMS technology. In addition, the embodiments herein do not provide for disengagement between the actuator ring and the driven wheel, thereby preventing slippage or loss of calibration or accuracy of the display indicators controlled by the driving arrangement due to any undesirable rotation of the driven wheel. The present invention also provides for the construction and use of a smaller and stronger driving assembly than heretofore seen in the art.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It should also be understood that the following claims are intended to cover all of the generic and specific features of the invention described herein and all statements of the scope of the invention that as a matter of language might fall therebetween.

What is claimed is:

1. A micro-electromechanical systems (MEMS) driving arrangement for an electronic device, the micro-electromechanical systems (MEMS) driving arrangement comprising:
  a driven wheel having a diameter, comprising (n) teeth about an outer periphery thereof, wherein (n) is a positive integer;
  an actuator ring having an inner diameter that is greater than the diameter of the driven wheel, comprising (n)+(x) teeth about an inner periphery thereof and wherein (x) is an integer of at least 1; wherein subsets of the (n)+(x) teeth of the actuator ring progressively engage and disengage subsets of the (n) teeth of the driven wheel;

a driving actuation assembly, coupled to the actuator ring, for driving the actuator ring in a hysteresis motion so as to cause rotation of the driven wheel, the driving actuation assembly comprising:
  a first driving actuator coupled to the actuator ring for selectively pulling the actuator ring in a first direction and pushing the actuator ring in a direction opposite the first direction thereby causing subsets of the (n)+(x) teeth of the actuator ring to engage and disengage subsets of the (n) teeth of the driven wheel;
  a second driving actuator coupled to the actuator ring for selectively pulling the actuator ring in a second direction and pushing the actuator ring in a direction opposite the second direction, wherein the first direction is perpendicular to the second direction, thereby causing the (n)+(x) teeth of the actuator ring to engage and disengage subsets of the (n) teeth of the driven wheel;
  wherein the driven wheel rotates in response to engagements and disengagements between selective subsets of the (n) teeth of the driven wheel with selective subsets of the (n)+(x) teeth of the actuator ring.

2. The micro-electromechanical systems (MEMS) driving arrangement as claimed in claim 1, wherein the driving actuation assembly:
  causes the actuator ring to move from an initial position where both the first driving actuator and the second driving actuator are each respectively pushing the actuator ring so that a subset of the (n)+(x) teeth of the actuator ring meshes with a subset of the (n) teeth of the driven wheel to a next position by causing the first driving actuator to pull the actuator ring while the second driving actuator continues pushing the actuator ring so that a different subset of the (n)+(x) teeth of the actuator ring mesh with a different subset of the (n) teeth of the driven wheel and then causes the actuator ring to move to a next position due to both the first driving actuator and second driving actuator each respectively pulling the actuator ring so that yet a different subset of the (n)+(x) teeth of the actuator ring meshes with a different subset of the (n) teeth of the driven wheel and thereafter, causing the actuator ring to move to a then next position due to the first driving actuator pushing the actuator ring and the second driving actuator continuing to pull the actuator ring so that yet a different subset of the (n)+(x) teeth of the actuator ring meshes with a different subset of the (n) teeth of the driven wheel and causing the actuator ring to move back to the initial position due to both the first driving actuator and the second driving actuator each respectively pushing the actuator ring so that yet a different subset of the (n)+(x) teeth of the actuator ring meshes with a different subset of the (n) teeth of the driven wheel.

3. The micro-electromechanical systems (MEMS) driving arrangement as claimed in claim 1, wherein (n) is in the range of about 300 to about 1000 and (x) is an integer equal to 1, 2, 3 or 4.

4. The micro-electromechanical systems (MEMS) driving arrangement as claimed in claim 1, wherein the driven wheel is driveable in both the clockwise and counterclockwise direction by the driving actuation assembly, and the driving actuation assembly comprises only two driving actuators.

5. The micro-electromechanical systems (MEMS) driving arrangement as claimed in claim 4, wherein at least a subset of the (n)+(x) teeth of the actuator ring is always meshing with a subset of the (n) teeth of the driven wheel.

6. The micro-electromechanical systems (MEMS) driving arrangement as claimed in claim 1, wherein at least a subset of the (n)+(x) teeth of the actuator ring is always meshing with a subset of the (n) teeth of the driven wheel.

7. The micro-electromechanical systems (MEMS) driving arrangement as claimed in claim 1, wherein each of the first and second driving actuators comprises:
  a driving element extending outwardly from a mobile part; and
  at least a first arm of a first length and at least a second arm spaced from the at least first arm and of a length different from the first length, wherein each of the at least first arm and second arm comprises:
    a first end coupled to the driving element; and
    a distal end connected to the actuator ring.

8. The micro-electromechanical systems (MEMS) driving arrangement as claimed in claim 7, wherein the driving element is one of linear, L-shaped or T-shaped.

9. A method of driving a driven wheel in a micro-electromechanical systems (MEMS) driving arrangement for an electronic device, wherein the micro-electromechanical systems (MEMS) driving arrangement comprises a driven wheel having a diameter, comprising (n) teeth about an outer periphery thereof, wherein (n) is a positive integer; an actuator ring having an inner diameter that is greater than the diameter of the driven wheel, comprising (n)+(x) teeth about an inner periphery thereof and wherein (x) is an integer of at least 1; wherein the (n)+(x) teeth of the actuator ring progressively engage and disengage subsets of (n) teeth of the driven wheel; a driving actuation assembly, coupled to the actuator ring, for driving the actuator ring in a hysteresis motion so as to cause rotation of the driven wheel, wherein the driving actuation assembly comprises a first driving actuator coupled to the actuator ring and a second driving actuator coupled to the actuator ring, wherein the method comprises the steps of:
  selectively pulling the actuator ring in a first direction and selectively pushing the actuator ring in a direction opposite the first direction with the first driving actuator thereby causing selected subsets of (n)+(x) teeth of the actuator ring to engage and disengage subsets of the (n) teeth of the driven wheel; and
  selectively pulling the actuator ring in a second direction and selectively pushing the actuator ring in a direction opposite the second direction with the second driving actuator thereby causing selected subsets of (n)+(x) teeth of the actuator ring to engage and disengage subsets of the (n) teeth of the driven wheel;
  wherein:
    the first direction is perpendicular to the second direction; and
    the driven wheel rotates in response to engagements and disengagements between selective subsets of the (n) teeth of the driven wheel with selective subsets of the (n)+(x) teeth of the actuator ring.

10. The method as claimed in claim 9, comprising the steps of:
  causing the actuator ring to move from an initial position where both the first driving actuator and the second driving actuator are each respectively pushing the actuator ring so that a subset of the (n)+(x) teeth of the actuator ring meshes with a subset of the (n) teeth of the driven wheel to a next position by causing the first driving actuator to pull the actuator ring while the second driving actuator continues pushing the actuator ring so that a different subset of the (n)+(x) teeth of the actuator ring meshes with a different subset of the (n) teeth of the driven wheel;
  causing the actuator ring to move to a then next position due to both the first driving actuator and second driving actuator each respectively pulling the actuator ring so that yet a different subset of the (n)+(x) teeth of the actuator ring meshes with a different subset of the (n) teeth of the driven wheel; and thereafter causing the actuator ring to move to a then next position due to the first driving actuator pushing the actuator ring and the second driving actuator continuing to pull the actuator ring so that yet a different subset of the (n)+(x) teeth of the actuator ring meshes with a different subset of the (n) teeth of the driven wheel; and thereafter causing the actuator ring to move back to the initial position due to both the first driving actuator and the second driving actuator each respectively pushing the actuator ring so that yet a different subset of the (n)+(x) teeth of the actuator ring meshes with a different subset of the (n) teeth of the driven wheel.

11. The method as claimed in claim 9, including the step of maintaining a continuous meshing of at least one or more of the (n)+(x) teeth of the actuator ring with one or more of the (n) teeth of the driven wheel throughout engagements and disengagements of the driven wheel and the actuator ring.

\* \* \* \* \*